(12) United States Patent
Mun et al.

(10) Patent No.: US 11,996,441 B2
(45) Date of Patent: May 28, 2024

(54) SEMICONDUCTOR DEVICE FOR HIGH VOLTAGE APPLICATIONS

(71) Applicant: GLOBALFOUNDRIES Singapore Pte. Ltd., Singapore (SG)

(72) Inventors: Bong Woong Mun, Singapore (SG); Kun Liu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 186 days.

(21) Appl. No.: 17/547,288

(22) Filed: Dec. 10, 2021

(65) Prior Publication Data

US 2023/0187483 A1 Jun. 15, 2023

(51) Int. Cl.
 *H01L 29/06* (2006.01)
 *H01L 21/762* (2006.01)
 *H01L 29/66* (2006.01)
 *H01L 29/78* (2006.01)

(52) U.S. Cl.
 CPC .... *H01L 29/0607* (2013.01); *H01L 21/76202* (2013.01); *H01L 21/76224* (2013.01); *H01L 29/66712* (2013.01); *H01L 29/7802* (2013.01)

(58) Field of Classification Search
 CPC ............. H01L 29/0607; H01L 29/7802; H01L 29/7816; H01L 29/7835
 See application file for complete search history.

(56) References Cited

U.S. PATENT DOCUMENTS

| 5,559,044 A * | 9/1996 | Williams ............ H01L 29/1004 |
| | | 257/E29.258 |
| 8,415,763 B2 | 4/2013 | Harame et al. |
| 9,590,097 B2 | 3/2017 | Yang et al. |
| 9,608,105 B2 | 3/2017 | Tamura et al. |
| 2021/0104630 A1* | 4/2021 | Chung ............. H01L 29/66659 |

* cited by examiner

*Primary Examiner* — Julia Slutsker
(74) *Attorney, Agent, or Firm* — VIERING JENTSCHURA & PARTNER MBB

(57) ABSTRACT

A device includes a first region disposed on a substrate, a second region disposed on the first region, a third region disposed in the second region and a first terminal region disposed in the third region. The first region comprises a discontinuous layer including at least one gap portion. The at least one gap portion comprises a portion of the substrate. The first region and the second region have a first conductivity type, and the substrate, the third region and the first terminal region have a second conductivity type. The first conductivity type is different from the second conductivity type.

20 Claims, 9 Drawing Sheets

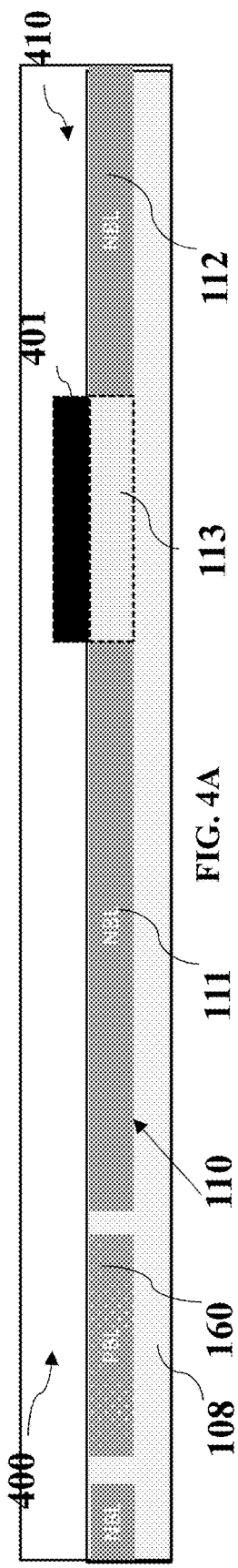
FIG. 4A
FIG. 4B
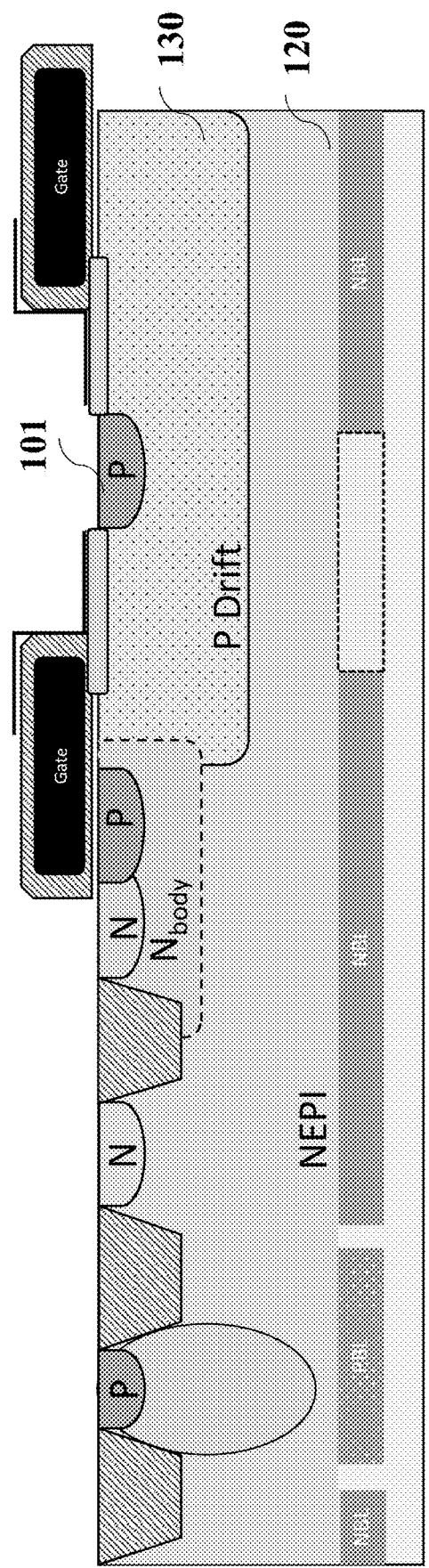
FIG. 4C

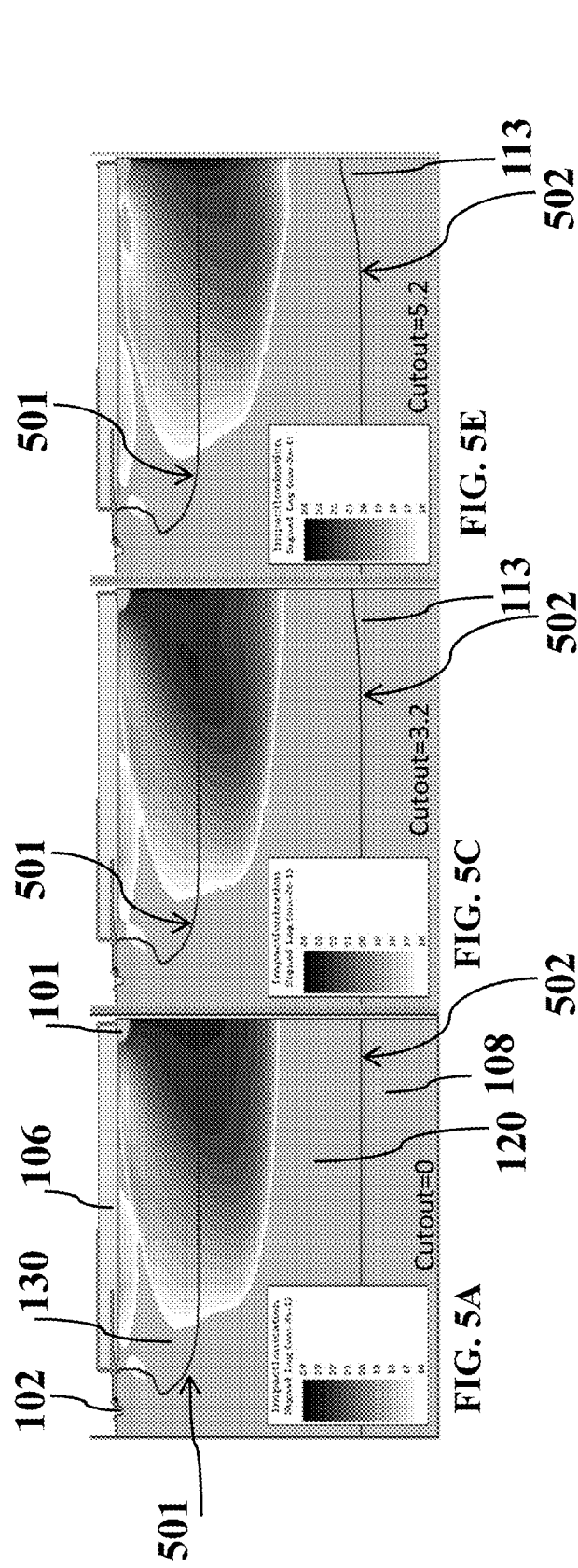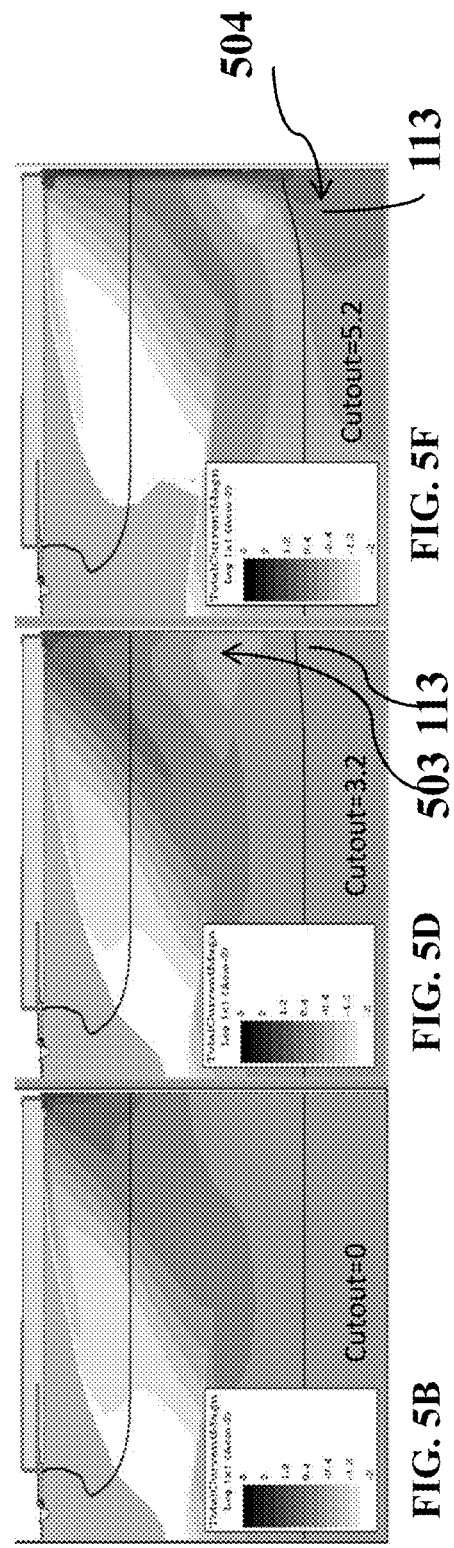
FIG. 5A FIG. 5C FIG. 5E
FIG. 5B FIG. 5D FIG. 5F

SEMICONDUCTOR DEVICE FOR HIGH VOLTAGE APPLICATIONS

TECHNICAL FIELD

The present disclosure relates generally to a semiconductor device for high voltage applications.

BACKGROUND

The voltage applied to a semiconductor device is constrained by the breakdown voltage of the device, which is the minimum voltage that causes avalanche breakdown in the device.

There is a need to increase voltage ratings for semiconductor devices.

SUMMARY

According to an aspect of the present disclosure, there is provided a device including: a first region disposed on a substrate, the first region comprising a discontinuous layer including at least one gap portion, wherein the at least one gap portion comprises a portion of the substrate; a second region disposed on the first region; a third region disposed in the second region; and a first terminal region disposed in the third region, wherein the first region and the second region have a first conductivity type; wherein the substrate, the third region and the first terminal region have a second conductivity type; and wherein the first conductivity type is different from the second conductivity type.

According to an aspect of the present disclosure, there is provided a method for manufacturing a device, including: providing a first region on a substrate, the first region comprising a discontinuous layer including at least one gap portion, wherein the at least one gap portion comprises a portion of the substrate; providing a second region on the first region; providing a third region in the second region; and providing a first terminal region in the third region, wherein the first region and the second region have a first conductivity type; wherein the substrate, the third region and the first terminal region have a second conductivity type; and wherein the first conductivity type is different from the second conductivity type.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same features throughout the different drawings. Also, the drawings are not necessarily to scale, emphasis instead generally being placed upon illustrating the principles of the disclosure. Embodiments of the disclosure will now be illustrated for the sake of example only with reference to the following drawings, in which:

FIGS. 4A to 4C show simplified cross-sectional views that illustrate a method for fabricating the device of FIG. 1A;

FIGS. 5A, 5C and 5E show simulated impact ionization levels and FIGS. 5B, 5D and 5F show simulated total current densities after the breakdown voltages for the device of FIG. 1A in technology computer aided design (TCAD)

DETAILED DESCRIPTION

Figure 1A:
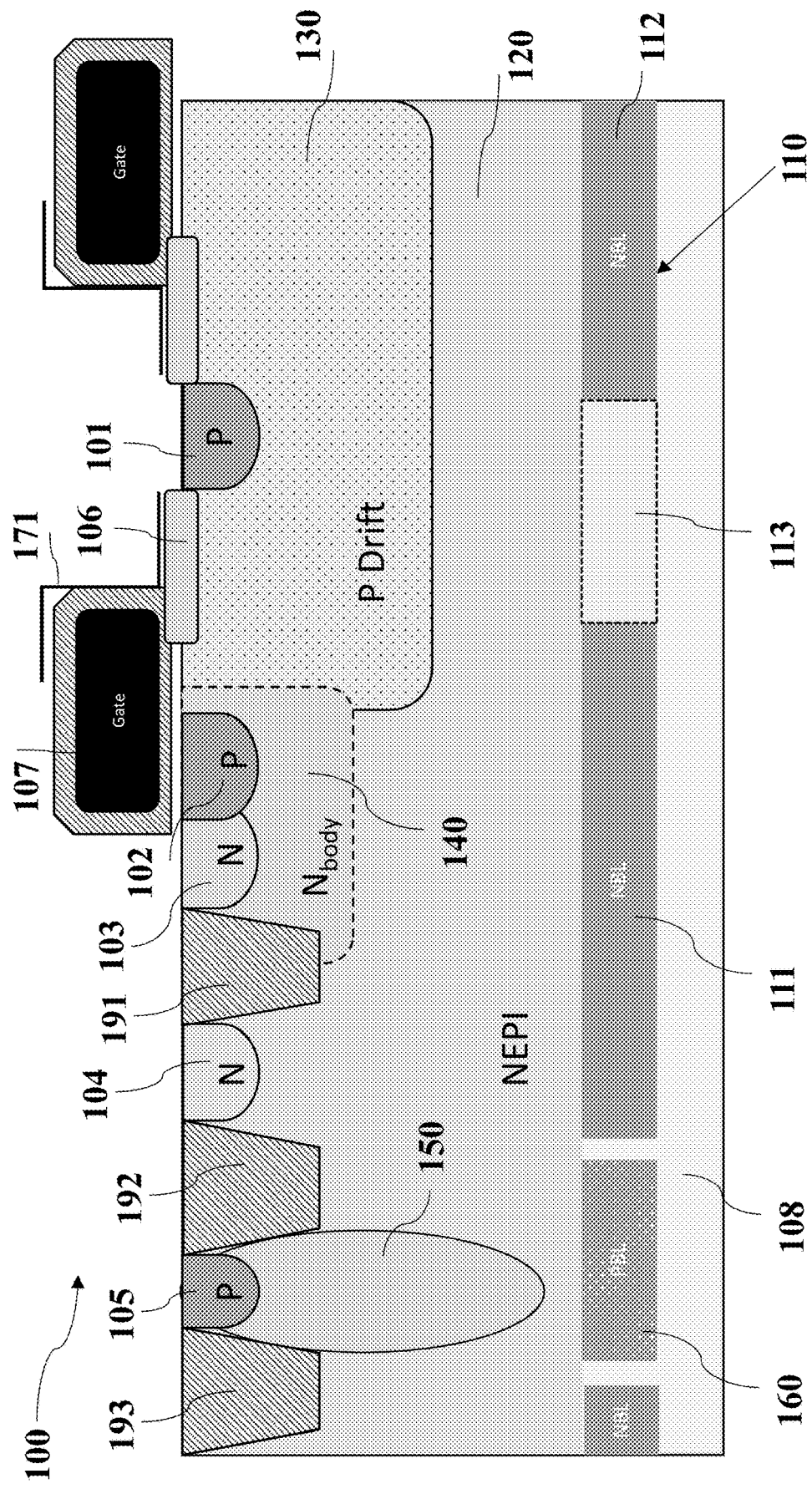
FIG. 1A shows a cross-sectional view of a semiconductor device for high voltage applications according to various embodiments of the present disclosure.

Embodiments generally relate to semiconductor devices. More particularly, some embodiments relate to semiconductor devices for high voltage applications including electric vehicles and Battery Management Systems (BMS).

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art from this disclosure.

The non-limiting embodiments described below in context of the devices are analogously valid for the respective methods, and vice versa. Furthermore, it will be understood that the embodiments described below may be combined; for example, a part of one embodiment may be combined with a part of another embodiment.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value. The word "or" is intended to include "and" unless the context clearly indicates otherwise.

The terminology used herein is for the purpose of describing particular examples only and is not intended to be limiting of the disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

It should be understood that the terms "on", "over", "top", "bottom", "down", "side", "back", "left", "right", "front", "lateral", "vertical", "side", "up", "down" etc., when used in the following description are used for convenience and to aid understanding of relative positions or directions, and not intended to limit the orientation of any device, or structure or any part of any device or structure. Similarly, the term "in" as used herein is not intended to limit a thing to be fully enclosed by something else. Further, the term "width" is intended to mean a length extending in the lateral direction with reference to the relevant drawings; the term "depth" is intended to mean a length extending in the vertical direction with reference to the relevant drawings.

As used herein, the term "connected," when used to refer to two physical elements, means a direct connection between the two physical elements. The term "coupled," however, can mean a direct connection or a connection through one or more intermediary elements. The term "coupled" (or "connected") herein may be understood as electrically coupled or as mechanically coupled, for example attached or fixed, or just in contact without any fixation, and it will be understood that both direct coupling or indirect coupling (in other words: coupling without direct contact) may be provided.

According to various non-limiting embodiments, a device may include: a first region disposed on a substrate, the first region comprising a discontinuous layer including at least one gap portion, wherein the at least one gap portion comprises a portion of the substrate; a second region disposed on the first region; a third region disposed in the second region; and a first terminal region disposed in the third region, wherein the first region and the second region have a first conductivity type; wherein the substrate, the third region and the first terminal region have a second conductivity type; and wherein the first conductivity type is different from the second conductivity type.

According to various non-limiting embodiments, the at least one gap portion may be located below the third region.

According to various non-limiting embodiments, the at least one gap portion may be located directly below the first terminal region.

According to various non-limiting embodiments, a length of the at least one gap portion in the lateral direction of the first region may be in the range of 1 um to 5 um.

According to various non-limiting embodiments, the length of the gap portion in the lateral direction of the first region may be approximately 3 um.

According to various non-limiting embodiments, the first region may comprise a plurality of gap portions laterally spaced apart.

According to various non-limiting embodiments, the first region may be a discontinuous buried layer and the second region is an epitaxial layer.

According to various non-limiting embodiments, the device may further comprise a fourth region having the first conductivity type disposed in the second region and in direct lateral contact with the third region.

According to various non-limiting embodiments, the device may further comprise a second terminal region having the second conductivity type and a third terminal region having the first conductivity type, wherein the second terminal region and the third terminal region are disposed in the fourth region and are in direct lateral contact.

According to various non-limiting embodiments, the device may further comprise: an oxide region disposed in the third region and between the first terminal region and the second terminal region; and a gate region disposed over the oxide region and in direct contact with the oxide region.

According to various non-limiting embodiments, the device may further comprise a first isolation region disposed in the fourth region and in direct lateral contact with the third terminal region.

According to various non-limiting embodiments, the device may further comprise a fourth terminal region having the first conductivity type and a second isolation region, wherein the fourth terminal region is disposed between the first isolation region and the second isolation region.

According to various non-limiting embodiments, the device may further comprise a fifth terminal region having the second conductivity type and a third isolation region, wherein the fifth terminal region is disposed between the second isolation region and the third isolation region.

According to various non-limiting embodiments, the device may further comprise a fifth region having the second conductivity type and in direct contact with the fifth terminal region.

According to various non-limiting embodiments, the device may further comprise a sixth region having the second conductivity type and disposed on the substrate, wherein the sixth region is laterally spaced apart from the first region and wherein the sixth region is direct contact with the fifth region.

According to various non-limiting embodiments, the first conductivity type may be opposite to the second conductivity type.

According to various non-limiting embodiments, the third region may be a drift region.

According to various non-limiting embodiments, a doping concentration of the first region may be greater than a doping concentration of the second region.

According to various non-limiting embodiments, a method for manufacturing a device may include: providing a first region on a substrate, the first region comprising a discontinuous layer including at least one gap portion, wherein the at least one gap portion comprises a portion of the substrate; providing a second region on the first region; providing a third region in the second region; and providing a first terminal region in the third region, wherein the first region and the second region have a first conductivity type; wherein the substrate, the third region and the first terminal region have a second conductivity type; and wherein the first conductivity type is different from the second conductivity type.

According to various non-limiting embodiments, the at least one gap portion may be located below the third region.

FIG. 1A shows a cross-sectional view of a semiconductor device 100 for high voltage applications according to various embodiments of the present disclosure. The device 100 may include a first region 110 disposed on a substrate 108. The substrate 108 may be a p-type substrate. The first region 110 may include an n-doped discontinuous buried layer suitable for high voltage applications. The discontinuous layer may include a first portion 111, a second portion 112, and at least one gap portion 113 disposed laterally between the first portion 111 and the second portion 112. The first portion 111 and the second portion 112 may include the n-doped buried layer. The at least one gap portion 113 may include a portion of the substrate 108. That is, the at least one gap portion, i.e., the discontinuous portion of the first region 110 exposes the substrate.

A length of the at least one gap portion 113 in the lateral direction of the first region 110 may be in the range of 1 um to 5 um, and in particular, may be approximately 3 um. The length of the gap portions may be selected in accordance with simulation results. The first region 110 may include a plurality of gap portions laterally spaced apart as described below in further details.

The device 100 may further include a second region 120 disposed on the first region 110 and a third region 130 disposed in the second region 120. The second region 120 may be an n-doped epitaxial layer. The second region 120 may directly contact the substrate 108 through the at least one gap portion 113 of the first region 110. The third region 130 may be a p-type drift region. The drift region may be provided to adjust the breakdown voltages. The device 100 may also include a fourth region 140 disposed in the second region 120 and coupled to the third region 130, particularly, in direct lateral contact with the third region 130. The fourth region 140 may be an n-doped body region. The body region may be doped at low concentrations, thus decreasing the effect of ionized impurity scattering on mobility of carriers in this region. The third region 130 may be partially overlap within the fourth region 140. The third region 130 may be disposed in the second region 120 at a lower depth than at which the fourth region 140 may be disposed in the second region 120. That is, a bottom of the third region 130 extends to a lower depth than a bottom of the fourth region 140. In an alternative embodiment, the third region 130 may be disposed in the second region 120 at a substantially same depth at which the fourth region 140 may be disposed in the second region 120. That is, a bottom of the third region 130 and a bottom of the fourth region 140 both extend to substantially the same depth. As used herein, the "substantially same" may include "absolutely the same" and "about the same within a reasonable range".

The device 100 may include a first terminal region 101 disposed in the third region 130, a second terminal region 102 disposed in the fourth region 140, an oxide region 106 disposed in the third region 130 and between the first terminal region 101 and the second terminal region 102, and a gate region 107 disposed over the oxide region 106 and coupled to, particularly, in direct contact with the oxide region 106. The device 100 may also include a silicide dielectric 171 for drain to gate isolation. The first terminal region 101 may be a p-type drain. The second terminal region 102 may be a p-type source.

The device 100 may further include a third terminal region 103 disposed in the fourth region 140 and coupled to, particularly, in direct lateral contact with the second terminal region 102. The device 100 may also include a first isolation region 191 coupled to, particularly, in direct lateral contact with the third terminal region 103. The first isolation region 191 may be disposed in the second region 120 and the fourth region 140; in other words, the first isolation region 191 may be disposed across the boundary between the second region 120 and the fourth region 140. The device 100 may also include a fourth terminal region 104 and a second isolation region 192 disposed in the second region 120, wherein the fourth terminal region 104 may be disposed between the first isolation region 191 and the second isolation region 192. The third terminal region 103 and the fourth terminal region 104 may be n-type terminals.

The device 100 may further include a fifth terminal region 105 and a third isolation region 193 disposed in the second region 120, wherein the fifth terminal region 105 may be disposed between the second isolation region 192 and the third isolation region 193. The fifth terminal region 105 may be a p-type terminal.

The device 100 may further include a fifth region 150 disposed in the second region 120 and coupled to, particularly, in direct contact with the fifth terminal region 105. The device 100 may also include a sixth region 160 disposed on the substrate 108, wherein the sixth region 160 may be a buried layer laterally spaced apart from the first region 110. The sixth region 160 may include a p-doped buried layer. The fifth region 150 may extend downward in the second region 120 and be coupled to, particularly, in direct contact with the sixth region 160, thereby forming a vertical path from the surface of the device 100 to the buried layer. The fifth region 150 may be a sinker region providing a low resistance connection from the surface of the device 100 to the buried layer.

The first region 110 and the sixth region 160 may be disposed on the substrate 108 so that their depths are at a substantially same depth. In an alternative embodiment, the depth of the sixth region 160 may be higher than the depth of the first region 110.

The isolation regions 191, 192, 193 may be shallow trench isolation (STI) or local oxidation of silicon (LOCOS) regions and have a cross-section of a trapezoid or a hexagonal prism.

In a non-limiting embodiment, the substrate 108 may include any silicon-containing substrate including, but not limited to, silicon (Si), single crystal silicon, polycrystalline Si, amorphous Si, silicon-on-sapphire (SOS), silicon-on-insulator (SOI) or silicon-on-replacement insulator (SRI) or silicon germanium substrates and the like. Substrate 110 may in addition or instead include various isolations, dopings and/or device features. The substrate 110 may include other suitable elementary semiconductors, such as, for example, germanium (Ge) in crystal, a compound semiconductor, such as silicon carbide (SiC), gallium arsenide (GaAs), gallium phosphide (GaP), indium phosphide (InP), indium arsenide (InAs), gallium nitride (GaN), aluminium nitride (AlN), indium nitride (InN), and/or indium antimonide (InSb) or combinations thereof; an alloy semiconductor including GaAsP, AlInAs, GaInAs, GaInP, AlGaN, or GaInAsP, or combinations thereof.

Figure 1B:
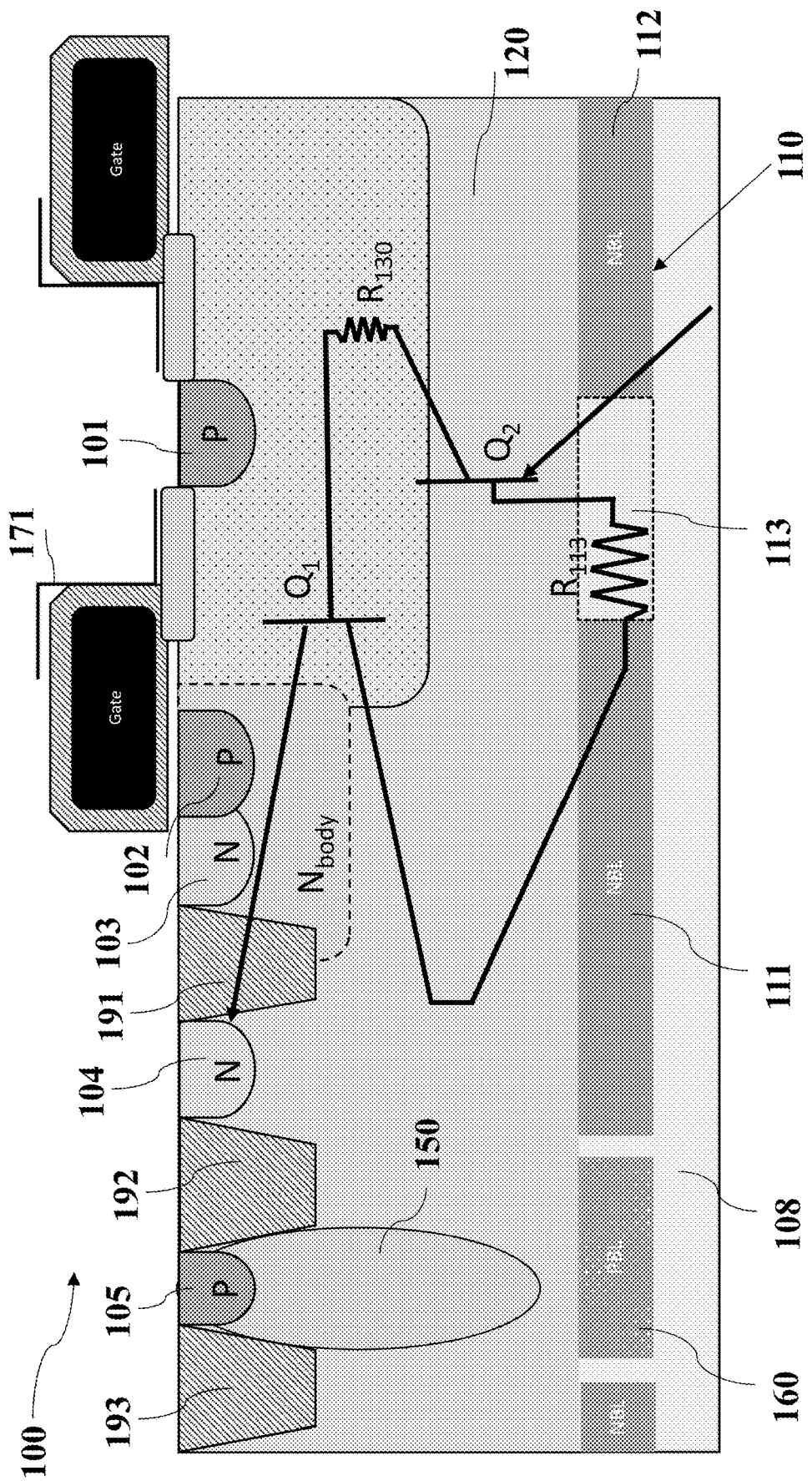
FIG. 1B shows an equivalent circuit of the device of FIG. 1A.

FIG. 1B shows an equivalent circuit of the device of FIG. 1A. The fourth region 140, the third region 130, and the second region 120 of the device 100 forms an NPN transistor $Q_1$. The third region 130, the second region 120, and the gap portion 113 of the first region 110 of the device 100 forms a PNP transistor $Q_2$. The equivalent circuit may also include resistors $R_{130}$, and $R_{113}$ corresponding to the resistance of the third region 130 and the gap portion 113 of the first region 110, respectively. The resistor $R_{130}$ may be connected between the base of the transistor $Q_1$ and the emitter of the transistor $Q_2$. The resistor $R_{113}$ may be connected between the collector of the transistor $Q_1$ and the base of the transistor $Q_2$.

The gap portion 113 of the first region 110 provides a higher resistance in the circuit in addition to the third drift region 130, resulting a higher breakdown voltage of the device 100. The resistance of the gap portion 113 may be adjusted by varying the length thereof. For example, the resistance of the gap portion 113 may be proportional to the length of the gap portion 113. The resistance of the gap portion 113 may also be adjusted by the doping concentration thereof. A position of the gap portion 113 may also affect the breakdown voltage of the device 100. For example, the gap portion 113 is preferred to be located below the third region 130, particularly, directly below the first terminal region 101 for high voltage applications, e.g. 100V to 200V. In this manner, a shorter and direct current path may be formed.

By introducing the gap portion 113 in the first region 110, a parasitic PNP structure is formed by the first terminal region 101, the third region 130, the second region 120, and the gap portion 113 of the first region 110 of the device 100. The effect on noise coupling performance due to increased parasitic PNP gain is studied and the decrease in noise couple performance is found to be negligible. A parasitic gain from 0.192 to 0.199, that is approximately 3% increase, is obtained.

Figure 1C:
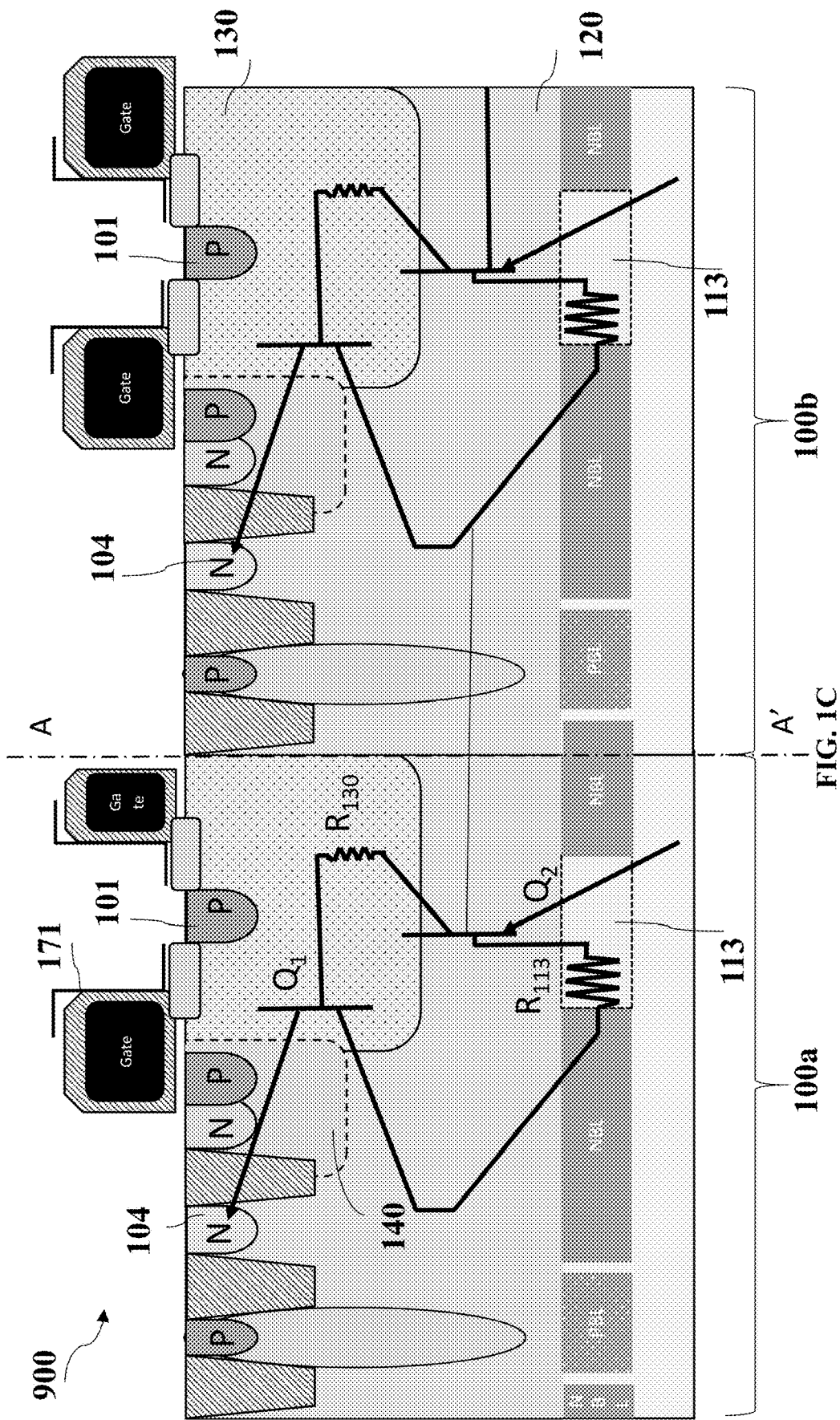
FIG. 1C shows a cross-sectional view of two semiconductor devices of FIG. 1A in series connection and an equivalent circuit thereof.

In various non-limiting embodiments, the device 900 may include two devices 100, denoted as a first segment 100a and a second segment 100b as shown in FIG. 1C, and disposed side by side about a vertical axis A-A'. Only some regions are labelled to avoid cluttering the figure and common features will have the same reference numerals. The circuit of the first segment 100a is in series connection with the circuit of the second segment 110b. Current flows through the first segment 100a of the device 100 may occur in the second segment 100b in the same manner. The device 900 may be modified such that it includes only either the first segment 100a or the second segment 100b. The device 900 may be also modified such that it includes multiple segments of 100a and 100b.

Figure 2:
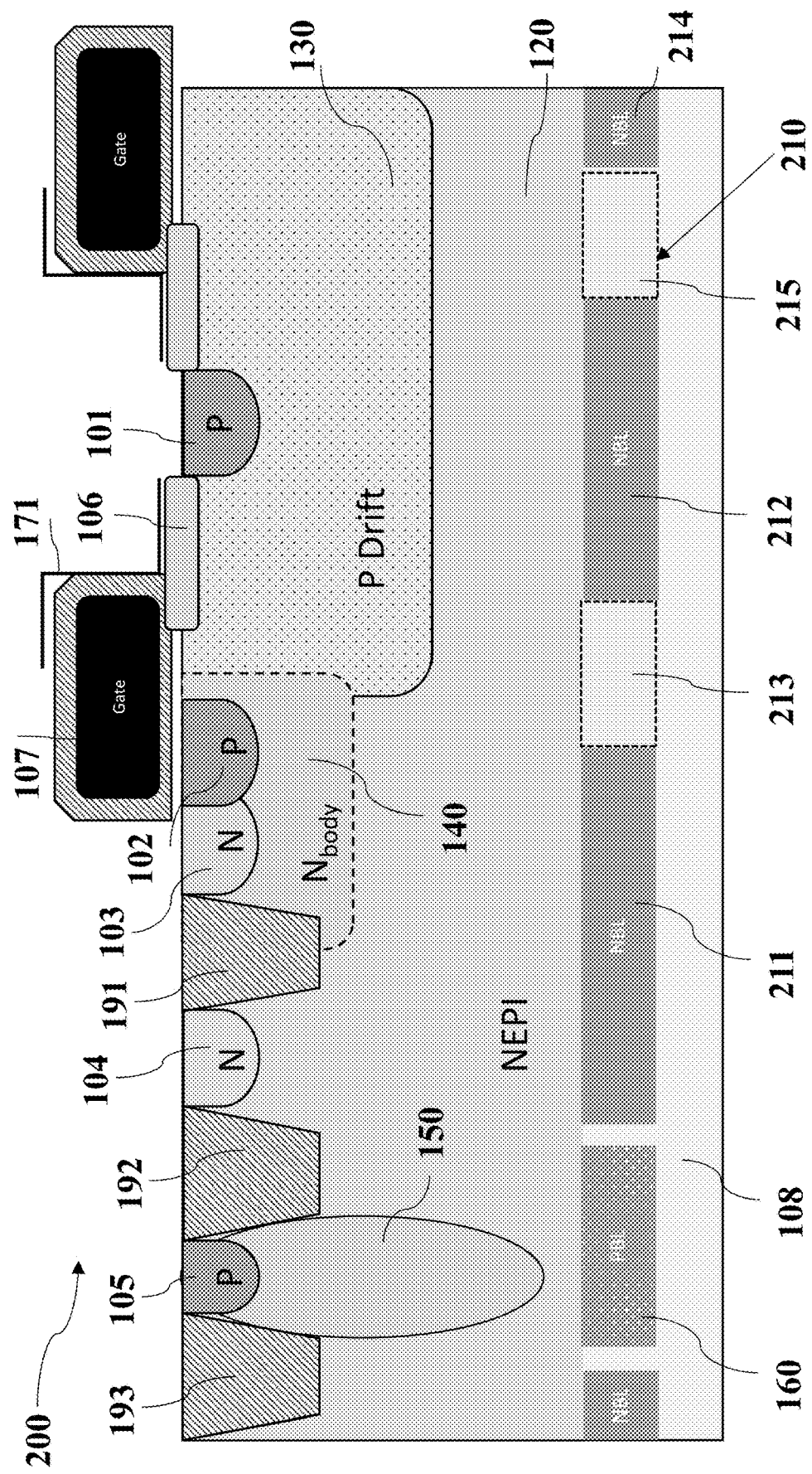
FIG. 2 shows a cross-sectional view of a semiconductor device for high voltage applications according to various embodiments of the present disclosure.

Now referring to FIG. 2, a device 200 is presented according to alternative non-limiting embodiments. The device 200 may include the features of the device 100 as described above in connection to FIGS. 1A and 1B, and therefore, the common features are labelled with the same reference numerals and need not be discussed.

The device 200 may include a first region 210 disposed on the substrate 108. The first region 210 may include an n-doped discontinuous buried layer suitable for high voltage applications. The discontinuous layer may include a first portion 211, a second portion 212, a third portion 214, and two gap portions 213, 215. The first gap portion 213 may be disposed laterally between the first portion 211 and the second portion 212 of the first region 210 and the second gap portion 215 may be disposed laterally between the second portion 212 and the third portion 214 of the first region 210. The first portion 211, the second portion 212 and the third portion 214 may include the n-doped buried layer. The gap portions 213, 215 may include portions of the substrate 108. That is, the gap portions, i.e., discontinuous portions of the first region, expose the substrate.

The length of the gap portion 213 in the lateral direction of the first region 210 may be substantially the same as the length of the gap portion 215 in the lateral direction of the first region 210. Alternatively, the length of the gap portion 213 in the lateral direction of the first region 210 may be different from the length of the gap portion 215 in the lateral direction of the first region 210. The gap portions 213, 215 may be disposed below the third region 130. The length of the second portion 212 may be the same as either length of the gap portions 213, 215; alternatively, the length of the second portion 212 may be smaller or larger than either length of the gap portions 213, 215.

Figure 3A:
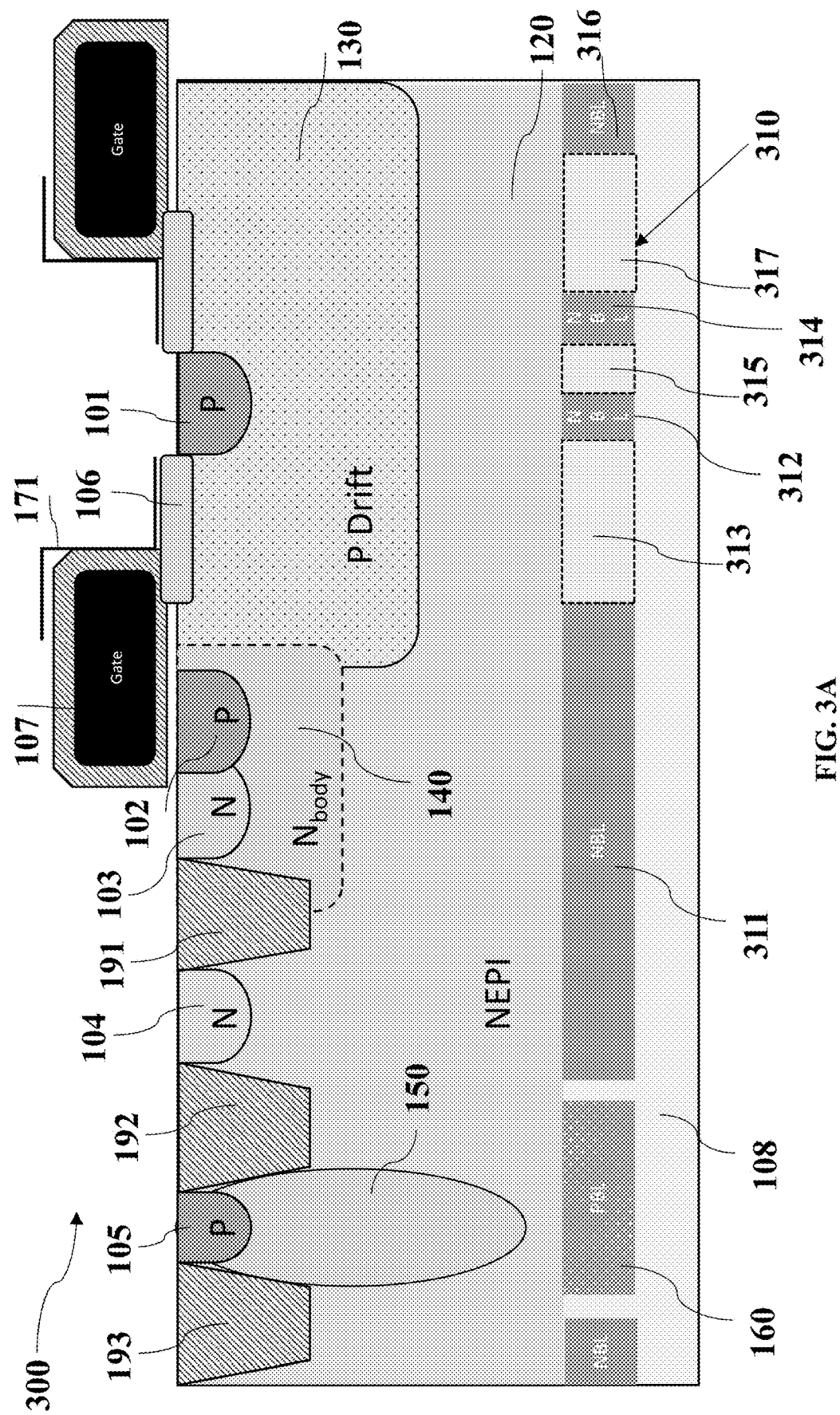
FIG. 3A shows a cross-sectional view of a semiconductor device for high voltage applications according to various embodiments of the present disclosure.
Figure 3B:
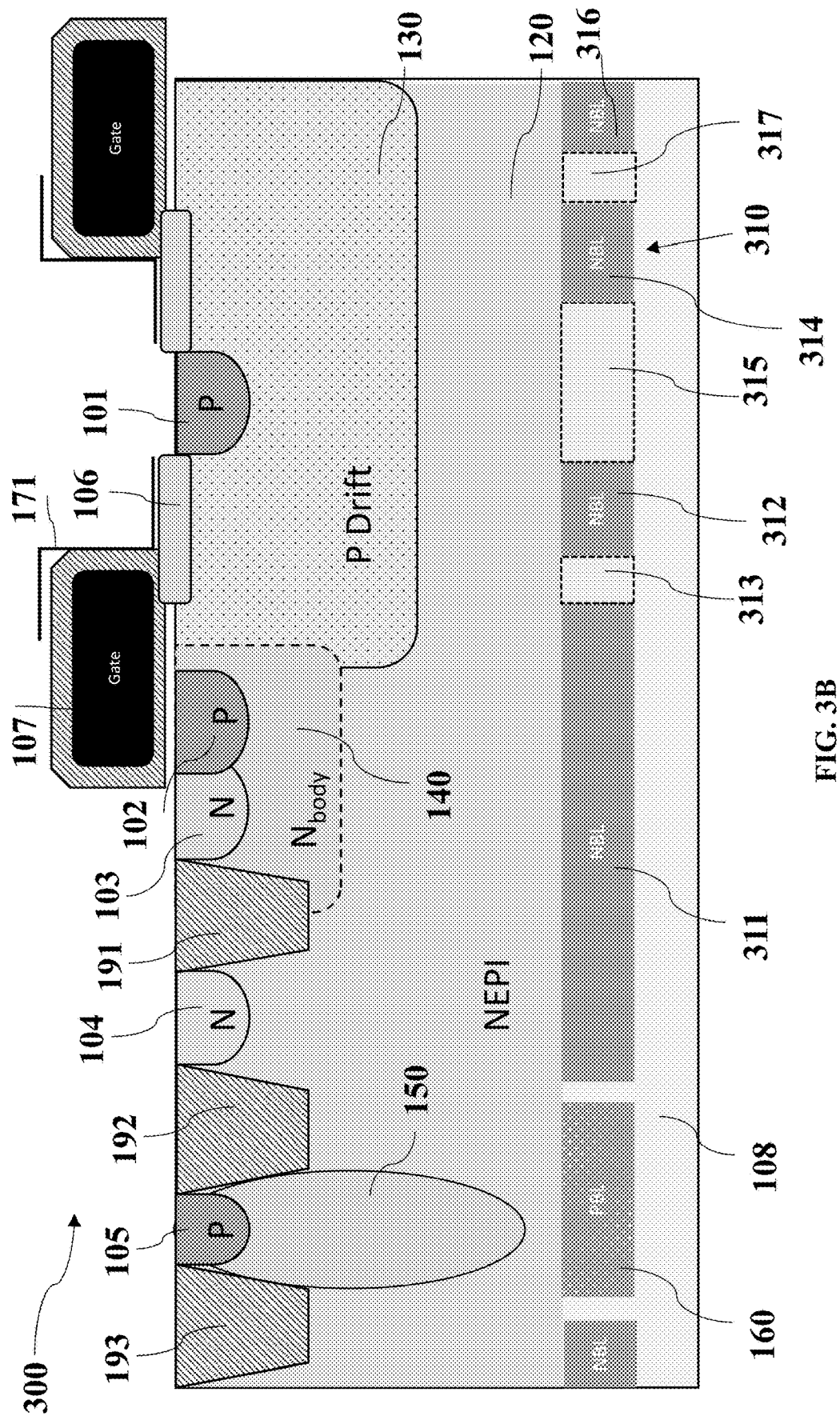
FIG. 3B shows a cross-sectional view of a semiconductor device for high voltage applications according to various other embodiments of the present disclosure.

Now referring to FIG. 3A and FIG. 3B, a device 300 is presented according to various alternative non-limiting embodiments. The device 300 may include the features of the device 100 and the device 200 as described above in connection to FIG. 1A, FIG. 1B and FIG. 2, and therefore, the common features are labelled with the same reference numerals and need not be discussed.

The device 300 may include a first region 310 disposed on the substrate 108. The first region 310 may include an n-doped discontinuous buried layer suitable for high voltage applications. The discontinuous layer may include a first portion 311, a second portion 312, a third portion 314, a fourth portion 316, and gap portions 313, 315, 317. A first gap portion 313 may be disposed laterally between the first portion 311 and second portion 312, a second gap portion 315 may be disposed laterally between the second portion 312 and third portion 314, and a third gap portion 317 may be disposed laterally between the third portion 314 and the fourth portion 316. The first portion 311, the second portion 312, the third portion 314 and the fourth portion 316 may include the n-doped buried layer. The gap portions 313, 315, 317 may include portions of the substrate 108. That is, the gap portions, i.e., discontinuous portions of the first region, exposes the substrate. The gap portions 313, 315, 317 may be disposed below the third region 130.

The lengths of the gap portions 313, 315, 317 in the lateral direction of the first region 310 may be substantially the same. Alternatively, the lengths of the gap portions 313, 315, 317 in the lateral direction of the first region 310 may be different. For example, the length of the gap portion 315 is smaller than the length of the gap portion 313 which is substantially the same as the length of the gap portion 317 as shown in FIG. 3A. In another example, the length of the gap portion 315 is larger than the length of the gap portion 313 which is substantially the same as the length of the gap portion 317 as shown in FIG. 3B. The lengths of the second portion 312 and the third portion 314 may be the same as any length of the gap portions 313, 315, 317; alternatively, the lengths of the second portion 312 and the third portion 314 may be smaller or larger than any length of the gap portions 313, 315, 317.

FIG. 4A to 4C show simplified cross-sectional views that illustrate a method 400 for fabricating the device 100 according to various non-limiting embodiments. The method 400 may include providing a first region 110 on a substrate 108, the first region 100 including a discontinuous layer, wherein the first region 100 includes a first portion 111, a second portion 112, and at least one gap portion 113 disposed laterally between the first portion 111 and the second portion 112, and wherein the at least one gap portion 113 includes a portion of the substrate 108; providing a second region 120 on the first region 110; providing a third region 130 in the second region 120; and providing a first terminal region 101 in the third region 130, wherein the first region 110 and the second region 120 have a first conductivity type; wherein the substrate 108, the third region 130 and the first terminal region 101 have a second conductivity type; and wherein the first conductivity type is different from the second conductivity type.

Referring to FIG. 4A, providing the first region 110 on the substrate 108 may include applying a patterned photoresist mask 401 to the surface of the substrate 108 during forming the first region 110 by doping or implanting semiconducting material (step 410). Accordingly, a gap portion 113 may be formed at where the mask 401 is placed, and a first portion 111 and a second portion 112 may be formed at unmasked portions and at each end of the gap portion 113. A sixth region 160 may be also formed by doping or implanting a different type of semiconducting material from the semiconducting material doped for the first region 110. In one example, the implant material for the first regions 110 may be phosphorus. For example, the p-type material may be or include, but is not limited to boron doped silicon as a material, and/or the n-type material may be or include, but is not limited to doped silicon material including phosphorus dopants, arsenic dopants, or combinations thereof.

Referring to FIG. 4B, the patterned photoresist mask 401 is subsequently removed (step 420). The method may further include front-end-of-line processes (step 430) as shown in FIG. 4C. The present method 400 incorporates prevailing processes (e.g., growing epitaxial material and implanting impurities) but provides a way to fabricate semiconductor devices with improved high voltage performances.

The above described order for the method is only intended to be illustrative, and the method is not limited to the above specifically described order unless otherwise specifically stated.

Figure 6:
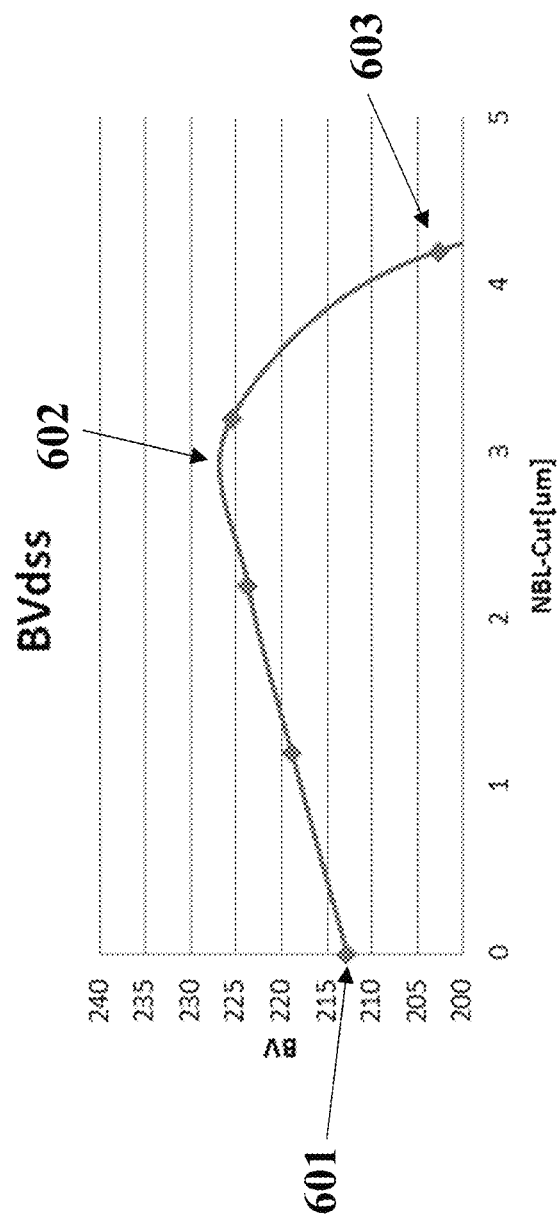
FIG. 6 shows the variation of the breakdown voltages of the device of FIG. 1A.

FIGS. 5A, 5C and 5E show simulated impact ionization levels for the device 100 of FIG. 1A in technology computer aided design (TCAD) when the length of the gap portion 113 of the device 100 is (A) zero, (C) 3.2 um and (E) 5.2 um; FIGS. 5B, 5D and 5F show total current distribution after the breakdown voltages for the device 100 of FIG. 1A in technology computer aided design (TCAD) when the length of the gap portion 113 of the device 100 is (B) zero, (D) 3.2 um and (F) 5.2 um. FIG. 6 shows the variation of the breakdown voltage of the device 100 of FIG. 1A in accordance with the length of the gap portion 113, where the horizontal axis represents the length of the gap portion 113 and the vertical axis represents the breakdown voltage of the device 100. The effect of the length of the gap portion 113 on the breakdown voltage will be discussed below with reference to FIGS. 5A to 5F and FIG. 6.

When the length of the gap portion 113 of the device 100 is zero, in other words, there is no gap portion and the first region is a continuous buried layer, the intensive contours are present from the first terminal region 101 to the third terminal region 103 as shown in FIGS. 5A and 5B, with strong impact ionization near the first terminal region 101 which is a drain terminal in this embodiment. Line 501 shows the junction between the second region 120 and the third region 130 and Line 502 shows the junction between the substrate 108 and the second region 120. The breakdown voltage of the device 100 is about 213V shown as 601 in FIG. 6.

The breakdown voltage of the device 100 increases as the length of the gap portion 113 increases from zero, and reaches to a maximum of about 227V when the length of the gap portion 113 increases to about 3 um shown as 602 in FIG. 6. When the length of the gap portion 113 of the device 100 is 3.2 um, the intensive contours are present from the first terminal region 101 to the third terminal region 103 as shown in FIGS. 5C and 5D, with strong impact ionization near the first terminal region 101. It can be seen from FIGS. 5A and 5C, the introduction of the gap portion 113 with certain length has minimal impact on the impact ionization of the device 100 in use; and from FIGS. 5B and 5D, current 503 appears by the introduction of the gap portion 113.

The breakdown voltage of the device 100 turns to decrease after reaching to the maximum as the length of the gap portion 113 continues to increase from about 3 um to 5um, and drops dramatically below 200V shown as 603 in FIG. 6, indicating that the larger length of the gap portion 113 causes vertical punch-through of the device 100. The less intensive contours are present from the first terminal region 101 to the third terminal region 103 as shown in FIGS. 5E and 5F, with weaker impact ionization near the first terminal region 101 due to the punch-through. The vertical junction breakdown is the major breakdown mechanism. FIG. 5F shows that current 504 which has higher density than current 503 goes to the substrate 108 through the gap portion 113 after the punch-through.

Various modifications can be made to the device 100 as described herein. Similar modifications as those described with reference to device 100 may be made to devices 200, 300.

For example, the lateral distance between the first terminal region 101 and the second terminal region 102 as shown in FIG. 1A may be varied. By varying this lateral distance, the lateral breakdown voltage of the device 100 can be adjusted with greater lateral distance resulting in higher lateral breakdown voltage. Similarly, the vertical distance between the first terminal region 101 and the first region 110 as shown in FIG. 1A, that is a sum of the depth of the third region 130 and the depth of the second region 120 between the third region 130 and the first region 110, may be varied. By varying this vertical distance, particularly, the depth of the second region 120 and/or the depth of the second region 120 between the third region 130 and the first region 110, the vertical breakdown voltage of the device 100 can be adjusted with greater vertical distance resulting in higher vertical breakdown voltage.

Furthermore, the width and/or depth of the fourth region 140 can be adjusted according to the electrical performances of the device 100. The width of the fifth region 150 can be adjusted so that a left boundary of the fifth region 150 is in direct contact with the third isolation region 193 and a right boundary of the fifth region 150 is in direct contact with the second isolation region 192.

In various non-limiting embodiments, the first region 110, the second region 120, the fourth region 140, the third terminal region 103 and the fourth terminal region 104 may have a first conductivity type; the third region 130, the fifth region 150, the first terminal region 101, the second terminal region 102, the fifth terminal region 105 and the sixth region 160 may have a second conductivity type; and the first conductivity type is different from the second conductivity type. In FIGS. 1A and 1B and their associated description herein, the first region 110, the second region 120, the fourth region 140, the third terminal region 103 and the fourth terminal region 104 are shown as n-doped conductivity; and the third region 130, the fifth region 150, the first terminal region 101, the second terminal region 102, the fifth terminal region 105 and the sixth region 160 are shown as p-doped conductivity. It can be understood by a person skilled in the art that the first region 110, the second region 120, the fourth region 140, the third terminal region 103 and the fourth terminal region 104 can have a different conductivity or an opposite conductivity, e.g. p-doped conductivity; and that the third region 130, the fifth region 150, the first terminal region 101, the second terminal region 102, the fifth terminal region 105 and the sixth region 160 can have a different conductivity, e.g. n-doped conductivity. The device 100 may also be modified such that only some regions are replaced with respective regions of an opposite conductivity type. For instance, the substrate 108 can be replaced with an n-type substrate, while the conductivity type of the rest of the device 100 remains the same. It would be clear to a person skilled in the art that the directions of current flows will change accordingly when the conductivity types of the various regions are reversed.

In various non-limiting embodiments, the regions of the same conductivity type may include one or more dopants or combinations thereof and may have the same doping concentrations (i.e. same concentration of dopants) or different doping concentrations (i.e. different concentrations of dopants) from each other. The terminal regions 101, 102, 105 may have the same doping concentration, and the terminal regions 103, 104 may have the same doping concentration. The doping concentrations of the terminal regions 101, 102 105 may be greater than the doping concentrations of the third region 130 and the fifth region 150, and the doping concentrations of the terminal regions 103, 104 may be greater than the doping concentrations of the second region 120 and the fourth region 140. The doping concentration of the sixth region 160 may be greater than the doping concentrations of the third region 130 and the fifth region 150. The doping concentration of the buried layer of the first region 110 may be greater than the doping concentrations of the second region 120 and the fourth conductivity 140.

Furthermore, the differences of the doping concentration between the second region 120, the third region 130 and the fourth region 140 may be varied according to the electrical requirements of device 100.

The doping levels of the various conductivity regions may be varied, the electrical characteristics and performance of the device 100 as described herein will be varied accordingly.

Furthermore, the positioning of the regions of the device 100, 200, 300 may be varied. In an example, the second terminal region 102 may be disposed in the third region 130. Additionally or alternatively, the third terminal region 103 may be disposed in the third region 130. In another example, the third region 130 and fourth region 140 may be positioned anywhere between the first terminal region 101 and the second terminal region 102, as long as at least a part of the third region 130 remains coupled with a part of the fourth region 140. For instance, at least a part of the third region 130 may be in direct contact with a part of the fourth region 140 or are not in direct contact but separated by only a spacing. The third region 130 may not be in contact with the fourth region 140 along the vertical boundaries, but instead, along a part of slanted boundaries as the case may be. Moreover, the overlapped boundaries between the third region 130 and the fourth region 140 may not be straight lines in a cross-sectional view or a flat surface.

In fact, the first isolation region 191 also need not be disposed partially within both the fourth region 140 and the second region 120 as shown in FIG. 1. Instead, the first isolation region 191 may be disposed within only the fourth region 140, or within only the second region 120. Furthermore, some regions may be optional. For example, the fourth terminal region 104 and the second isolation region 192 may be omitted.

The isolation regions 191, 192, 193, may be positioned differently. The cross-sectional view of the isolation regions 191, 192, 193, may be any shape other than trapezoid. The size of the isolation regions 191, 192, 193, may be the same or different and be adjusted to be less or larger in the lateral direction or in the vertical direction.

In addition, the surfaces of the devices 100, 200, 300 are not intended to limit to flat surfaces. In various non-limiting embodiments, the surfaces of the devices 100, 200, 300 can be curved surfaces or have steps.

The disclosure may be embodied in other specific forms without departing from the spirit or essential characteristics thereof. The foregoing embodiments, therefore, are to be considered in all respects illustrative rather than limiting the disclosure described herein. Scope of the disclosure is thus indicated by the appended claims, rather than by the foregoing description, and all changes that come within the meaning and range of equivalency of the claims are intended to be embraced therein.

The invention claimed is:

1. A semiconductor device comprising:
a first region disposed on a substrate, the first region comprising a discontinuous layer including at least one gap portion, wherein the at least one gap portion comprises a portion of the substrate;
a second region disposed on the first region;
a third region disposed in the second region; and
a first terminal region disposed in the third region,
wherein the at least one gap portion is located directly below the third region; wherein the first region and the second region have a first conductivity type; wherein the substrate, the third region and the first terminal region have a second conductivity type; and wherein the first conductivity type is different from the second conductivity type.

2. The semiconductor device according to claim 1, wherein the at least one gap portion is located directly below the first terminal region.

3. The semiconductor device according to claim 1, wherein a length of the at least one gap portion in the lateral direction of the first region is in the range of 1 um to 5 um.

4. The semiconductor device according to claim 3, wherein the length of the gap portion in the lateral direction of the first region is approximately 3 um.

5. The semiconductor device according to claim 1, wherein the first region comprises a plurality of gap portions laterally spaced apart.

6. The semiconductor device according to claim 1, wherein the first region is a discontinuous buried layer and the second region is an epitaxial layer.

7. The semiconductor device according to claim 1, the device further comprises a fourth region having the first conductivity type disposed in the second region and in direct lateral contact with the third region.

8. The semiconductor device according to claim 7, the device further comprises a second terminal region having the second conductivity type and a third terminal region having the first conductivity type, wherein the second terminal region and the third terminal region are disposed in the fourth region and are in direct lateral contact.

9. The semiconductor device according to claim 8, the device further comprises:
an oxide region disposed in the third region and between the first terminal region and the second terminal region; and
a gate region disposed over the oxide region and in direct contact with the oxide region.

10. The semiconductor device according to claim 8, the device further comprises a first isolation region disposed in the fourth region and in direct lateral contact with the third terminal region.

11. The semiconductor device according to claim 10, the device further comprises a fourth terminal region having the first conductivity type and a second isolation region, wherein the fourth terminal region is disposed between the first isolation region and the second isolation region.

12. The semiconductor device according to claim 11, the device further comprises a fifth terminal region having the second conductivity type and a third isolation region, wherein the fifth terminal region is disposed between the second isolation region and the third isolation region.

13. The semiconductor device according to claim 12, the device further comprises a fifth region having the second conductivity type and in direct contact with the fifth terminal region.

14. The semiconductor device according to claim 13, the device further comprises a sixth region having the second conductivity type and disposed on the substrate, wherein the sixth region is laterally spaced apart from the first region and wherein the sixth region is direct contact with the fifth region.

15. The semiconductor device according to claim 1, wherein the first conductivity type is opposite to the second conductivity type.

16. The semiconductor device according to claim 1, wherein the third region is a drift region.

17. The semiconductor device according to claim 1, wherein a doping concentration of the first region is greater than a doping concentration of the second region.

18. A method for manufacturing a semiconductor device, comprising:

providing a first region on a substrate, the first region comprising a discontinuous layer including at least one gap portion, wherein the at least one gap portion comprises a portion of the substrate;
providing a second region on the first region;
providing a third region in the second region; and
providing a first terminal region in the third region,
wherein the at least one gap portion is located directly below the third region;
wherein the first region and the second region have a first conductivity type;
wherein the substrate, the third region and the first terminal region have a second conductivity type; and
wherein the first conductivity type is different from the second conductivity type.

19. The method of claim 18, wherein the at least one gap portion is located below the first terminal region.

20. The semiconductor device according to claim 5, wherein the plurality of gap portions are located directly below the third region.

\* \* \* \* \*